United States Patent
Choi et al.

(10) Patent No.: US 8,331,149 B2
(45) Date of Patent: Dec. 11, 2012

(54) 3D NONVOLATILE MEMORY DEVICE AND METHOD FOR FABRICATING THE SAME

(75) Inventors: Won-Joon Choi, Gyeonggi-do (KR);
Moon-Sig Joo, Gyeonggi-do (KR);
Ki-Hong Lee, Gyeonggi-do (KR);
Beom-Yong Kim, Gyeonggi-do (KR);
Jun-Yeol Cho, Gyeonggi-do (KR);
Young-Wook Lee, Gyeonggi-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 381 days.

(21) Appl. No.: 12/781,926

(22) Filed: May 18, 2010

(65) Prior Publication Data
US 2011/0058418 A1    Mar. 10, 2011

(30) Foreign Application Priority Data

Sep. 7, 2009   (KR) ........................ 10-2009-0084104

(51) Int. Cl.
*G11C 16/04* (2006.01)
(52) U.S. Cl. ............... 365/185.05; 365/185.17; 257/329
(58) Field of Classification Search ............. 365/185.05, 365/185.17; 257/329
See application file for complete search history.

(56) References Cited

U.S. PATENT DOCUMENTS

| 2008/0149913 | A1 | 6/2008 | Tanaka et al. |
| 2008/0173932 | A1 | 7/2008 | Kidoh et al. |
| 2008/0253183 | A1* | 10/2008 | Mizukami et al. ....... 365/185.05 |
| 2009/0090960 | A1 | 4/2009 | Izumi et al. |

FOREIGN PATENT DOCUMENTS

| JP | 2009-200443 | 9/2009 |
| KR | 1020090125893 A | 12/2009 |
| KR | 1020100067168 | 6/2010 |
| KR | 1020100068522 | 6/2010 |
| KR | 1020100119625 | 11/2010 |

OTHER PUBLICATIONS

Notice of Allowance issued from Korean Intellectual Property Office on Mar. 28, 2011.

* cited by examiner

*Primary Examiner* — Huan Hoang
(74) *Attorney, Agent, or Firm* — IP & T Group LLP

(57) ABSTRACT

A 3D nonvolatile memory device includes: a plurality of channel structures including a plurality of channel layers and interlayer dielectric layers, which are alternately stacked, and extended in a first direction; a plurality of word lines extended in a second direction at least substantially perpendicular to the first direction; a plurality of row select lines connected to the plurality of channel layers, respectively, and extended in the second direction; and a plurality of column select lines connected to the plurality of channel structures, respectively, and extended in the first direction.

23 Claims, 13 Drawing Sheets

3D NONVOLATILE MEMORY DEVICE AND METHOD FOR FABRICATING THE SAME

CROSS-REFERENCE TO RELATED APPLICATIONS

The present application claims priority of Korean Patent Application No. 10-2009-0084104, filed on Sep. 7, 2009, which is incorporated herein by reference in its entirety.

BACKGROUND OF THE INVENTION

Exemplary embodiments of the present invention relate to a semiconductor device and a method for fabricating the same, and more particularly, to a three dimensional 3D nonvolatile memory device and a method for fabricating the same.

Nonvolatile memory devices maintain data stored therein, even though power supply is cut off. Recently, as the increase in integration degree of two dimensional (2D) memory devices in which memory cells are formed as a single layer on a silicon substrate approaches the limit, 3D nonvolatile memory devices in which memory cells are vertically stacked from a silicon substrate have been proposed.

Hereafter, a conventional method for fabricating a 3D nonvolatile memory device will be described with FIGS. 1A to 1D.

Figure 1A:
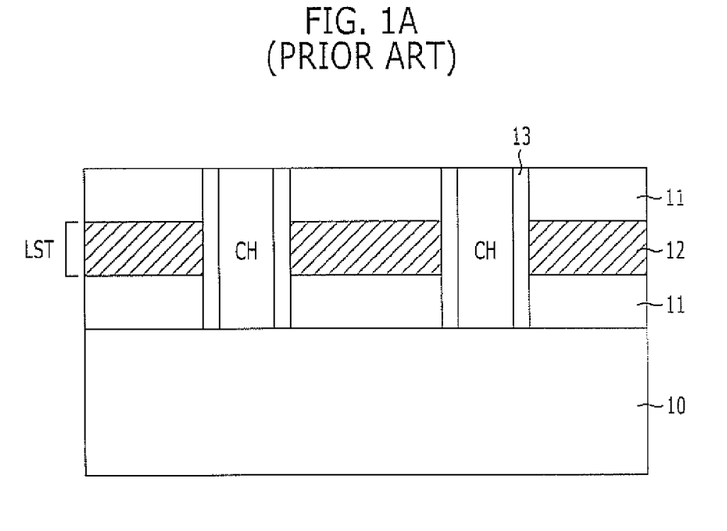
FIGS. 1A to 1C are cross-sectional views illustrating a conventional method for fabricating a 3D nonvolatile memory device.
Figure 1B:
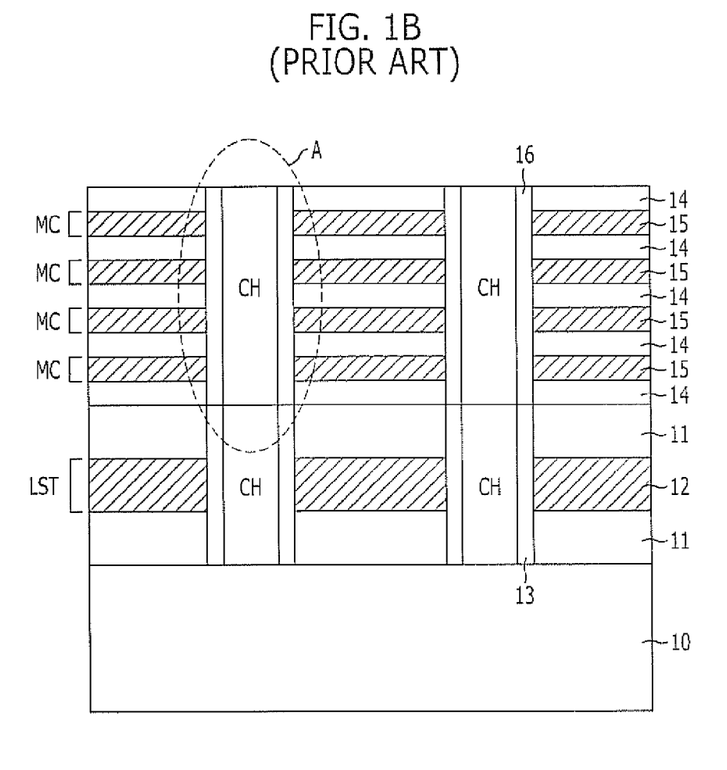
Figure 1C:
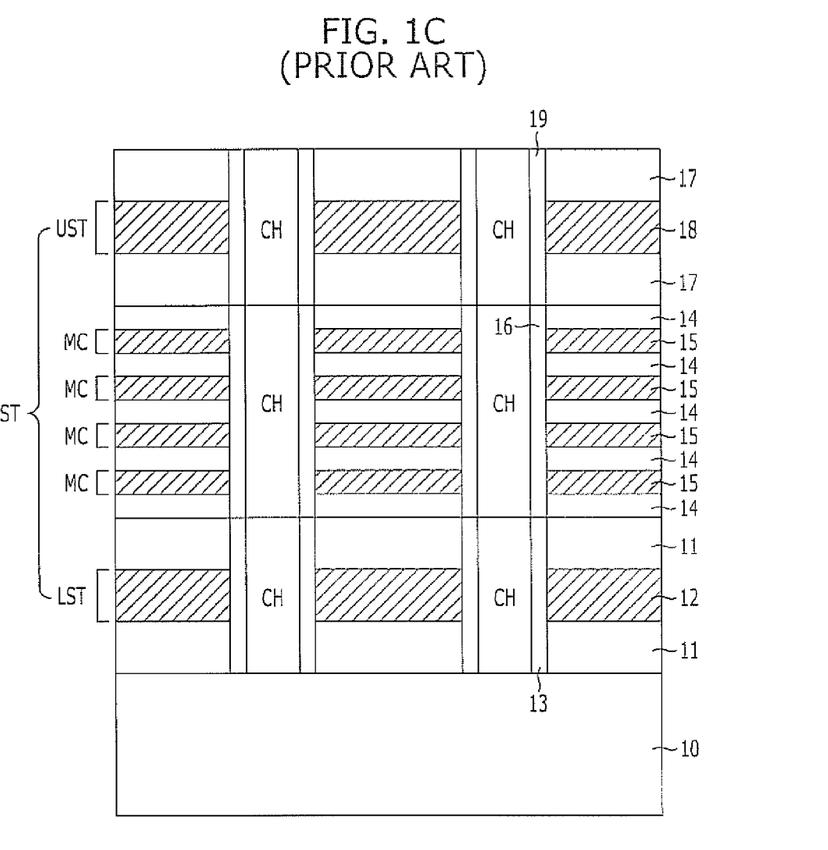

FIGS. 1A to 1C are cross-sectional views illustrating a conventional method for fabricating a 3D nonvolatile memory device. In particular, FIGS. 1A to 1C are process diagrams explaining a method for fabricating a vertical channel nonvolatile memory device in which strings are vertically arranged on a substrate.

Referring to FIG. 1A, a plurality of interlayer dielectric layers 11 and gate electrode conductive layers 12 are alternately formed over a substrate 10, and then etched to form a plurality of trenches exposing the substrate 10.

A gate dielectric layer 13 is formed on the inner walls of the trenches, and a channel formation layer is buried in the trenches having the gate dielectric layer 13 formed on the inner walls thereof, thereby forming a plurality of channels CH. Accordingly, a lower select transistor LST is formed.

Referring to FIG. 1B, a plurality of interlayer dielectric layers 14 and gate electrode conductive layers 15 are alternately formed over the resultant structure having the lower select transistor LST formed on the inner walls thereof, and then are etched to form a plurality of trenches exposing the respective channels CH of the lower select transistor LST.

A charge blocking layer, a charge trap layer, and a tunnel insulating layer are sequentially formed on the inner walls of the trenches. For convenience of description, the charge blocking layer, the charge trap layer, and the tunnel insulating layer are illustrated as one layer represented by reference numeral 16.

A channel formation layer is buried in the trenches having the charge blocking layer, the charge trap layer, and the tunnel insulating layer formed on the inner walls thereof, thereby forming a plurality of channels CH. Accordingly, a plurality of memory cells MC are formed.

Referring to FIG. 1C, a plurality of interlayer dielectric layers 17 and gate electrode conductive layers 18 are alternately formed over the resultant structure having the plurality of memory cells MC formed therein, and are subsequently etched to form a plurality of trenches exposing the channels CH of the memory cells MC.

A gate dielectric layer 19 is formed on the inner walls of the trenches, and a channel formation layer is buried in the trenches having the gate dielectric layer 19 formed on the inner walls thereof, thereby forming a plurality of channels CH. Accordingly, an upper select transistor UST is formed.

In accordance with the above-described conventional method for forming a 3D nonvolatile memory device, the lower select transistor LST, the plurality of memory cells MC, and the upper select transistor UST, which are stacked over the substrate 10, constitute one string ST. When the strings ST are vertically arranged from the substrate 10, the integration degree of the memory device may be increased, compared with a conventional 2D nonvolatile memory device.

In the conventional method for forming a 3D nonvolatile memory device, however, the fabricating process is complex, and the arrangement of the channels CH is not relatively easy to perform. Furthermore, since the widths of the channels CH are not uniform, a concern is raised in controlling a threshold voltage. Such a concern will be described below in more detail.

First, in accordance with the conventional method for fabricating a 3D nonvolatile memory device, the plurality of memory cells MC and the upper select transistor UST are sequentially formed after the lower select transistor LST is formed on the substrate 10. That is, since one string is formed through at least three steps, the fabricating process becomes relatively complex, and the fabricating cost may increase.

Furthermore, the respective channels CH of the lower select transistor LST, the memory cells MC, and the upper select transistor UST are desired to be aligned for being integrally connected. However, the channels CH may not easily align with each other, due to the process limitation. In particular, since the overlay control margin decreases as the integration degree of the memory device increases, the channels CH may be further misaligned with each other as the integration degree of the memory device increases.

Second, when the strings are vertically arranged on the substrate 10, the plurality of interlayer dielectric layers 14 and the plurality of gate electrode conductive layers 15 are etched by one process to form the trench for the plurality of memory cells MC. That is, the trench having a high aspect ratio is formed. However, the width of the trench may decrease toward the lower part of the trench, due to the limitation of the etching process. Such a concern is illustrated in FIG. 1D.

Figure 1D:
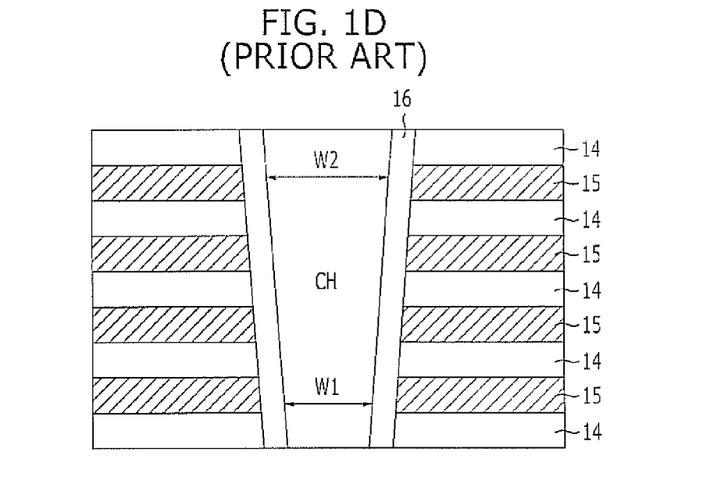
FIG. 1D is a diagram showing an expanded view of a region 'A' of FIG. 1B.

FIG. 1D is a diagram showing an expanded view of a cross-section of the above-described intermediate structure of FIG. 1B in the area denoted by A in FIG. 1B. Referring to FIG. 1D, it can be seen that the width of the channel CH decreases toward the lower part thereof. That is, the memory cells MC formed in the upper part of the intermediate structure have a larger channel width W2 than the memory cells MC formed in the lower part thereof, which have a channel width W1. Such a difference in the channel widths among the plurality of memory cells MC makes the threshold voltage of the memory cells MC non-uniform. Thus, there is a concern in controlling the threshold voltage of the memory cells.

In particular, since the number of memory cells MC to be stacked increases with the increase in integration degree of memory devices, the depth of the trench is further increased with the increase in integration degree of memory devices. Accordingly, such a concern with controlling the threshold voltage of memory cells becomes more significant.

SUMMARY OF THE INVENTION

An embodiment of the present invention is directed to a 3D nonvolatile memory device, which simplifies a fabricating process and uniformizes channel widths to easily control a threshold voltage, and a method for fabricating the same.

In accordance with an embodiment of the present invention, a three dimensional (3D) nonvolatile memory device includes: a plurality of channel structures including a plurality of channel layers and interlayer dielectric layers, which are alternately stacked, and extended in a first direction; a plurality of word lines extended in a second direction at least substantially perpendicular to the first direction; a plurality of row select lines connected to the plurality of channel layers, respectively, and extended in the second direction; and a plurality of column select lines connected to the plurality of channel structures, respectively, and extended in the first direction.

In accordance with another embodiment of the present invention, a 3D nonvolatile memory device includes: a plurality of gate structures including a plurality of interlayer dielectric layers and gate electrode layers, which are alternately stacked, and extended in a first direction; a plurality of channel lines extended in a second direction substantially perpendicular to the first direction; a plurality of select lines connected to the plurality of channel lines, respectively; a plurality of select gates buried in the respective select lines and connected to the respective channel lines.

In accordance with yet another embodiment of the present invention, a method for fabricating a 3D nonvolatile memory device includes: forming a plurality of channel structures over a substrate, the plurality of channel structures comprising a plurality of channel layers and interlayer dielectric layers, which are alternately stacked, and extended in a first direction; forming a plurality of word lines extended in a second direction substantially perpendicular to the first direction; forming a plurality of row select lines connected to the plurality of channel layers, respectively, and extended in the second direction; and forming a plurality of column select lines connected to the plurality of channel structures, respectively, and extended in the first direction.

DESCRIPTION OF SPECIFIC EMBODIMENTS

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIGS. 2A to 2H are perspective views explaining a method for fabricating a 3D nonvolatile memory device in accordance with a first embodiment of the present invention.

Figure 2A:
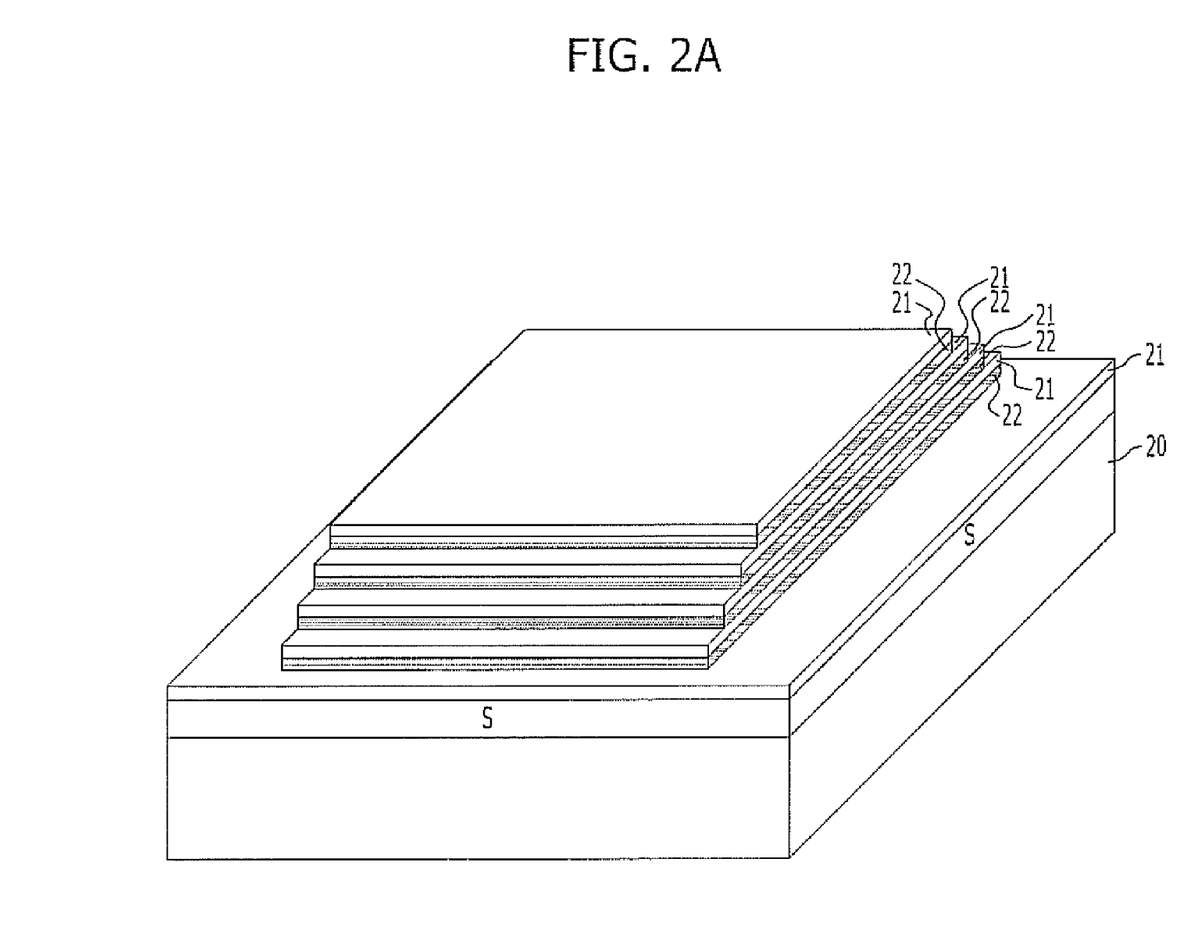
FIGS. 2A to 2H are perspective views illustrating a method for fabricating a 3D nonvolatile memory device in accordance with a first embodiment of the present invention.

Referring to FIG. 2A, a plurality of interlayer dielectric layers 21 and channel formation layers 22 are alternately stacked over a substrate 20 having a required lower structure including a source region S and any other regions.

The interlayer dielectric layers 21 are provided as separation layers for separating a plurality of memory cells stacked over the substrate 20 from each other. The channel formation layers 22 are provided to form channels of the memory cells. The number of channel formation layers 22 to be stacked corresponds to the number of memory cells to be stacked. For example, FIG. 2A illustrates a case in which four memory cells are stacked.

The plurality of interlayer dielectric layers 21 and the plurality of channel formation layers 22 are etched, where the plurality of channel formation layers 22 are exposed in the etched structure. This etching process is performed to enable a connection of a plurality of row select lines formed in a subsequent process to a plurality of channel layers, respectively. The etching process may be performed in such a manner that the sidewalls of the interlayer dielectric layers 21 and the channel formation layer 22 are formed in a stair shape.

FIG. 2A illustrates a case in which sidewalls of the interlayer dielectric layers 21 and the channel formation layers 22 on both sides of the interlayer dielectric layers 21 and the channel formation layers 22 are patterned in a stair shape. Alternatively, sidewalls of the interlayer dielectric layers 21 and the channel formation layers 22 on just one side of the interlayer dielectric layers 21 and the channel formation layers 22 may be patterned in a stair shape.

Figure 2B:
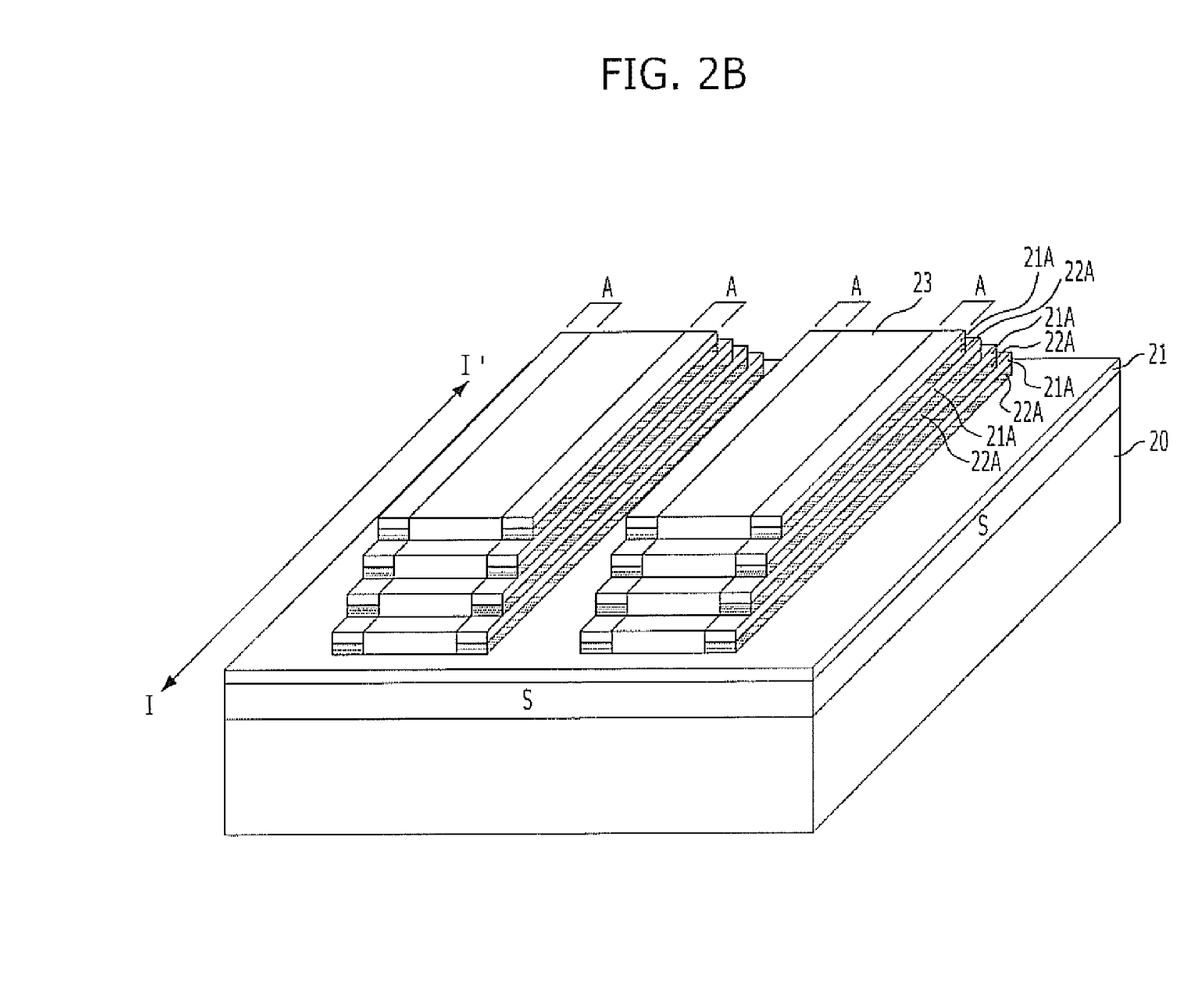

Referring to FIG. 2B, the plurality of interlayer dielectric layers 21 and the plurality of channel formation layers 22 are etched to form a plurality of channel structures A extended in parallel to a first direction I-I'. The channel structures A include the plurality of respective interlayer dielectric layers and the plurality of respective channel layers. In patterning the channel formation layers 22 to form the plurality of channel layers, the plurality of channel layers 22A have a uniform width.

FIG. 2B illustrates a case in which four channel structures A are formed, as an example. In FIG. 2B, the interlayer dielectric layers constituting the channel structure A are denoted by reference numeral 21A, and the channel layers constituting the channel structure A are denoted by reference numeral 22A.

The plurality of channel structures A are formed at predetermined intervals from each other. The channel structures A may be patterned in consideration of thicknesses of a charge blocking layer, a charge capture layer, a tunnel insulating layer, and a gate electrode that are to be formed in a subsequent process.

Gap regions between the respective channel structures A may be alternatively filled with an insulating layer 23. The insulating layer 23 may be formed of an oxide layer.

Figure 2C:
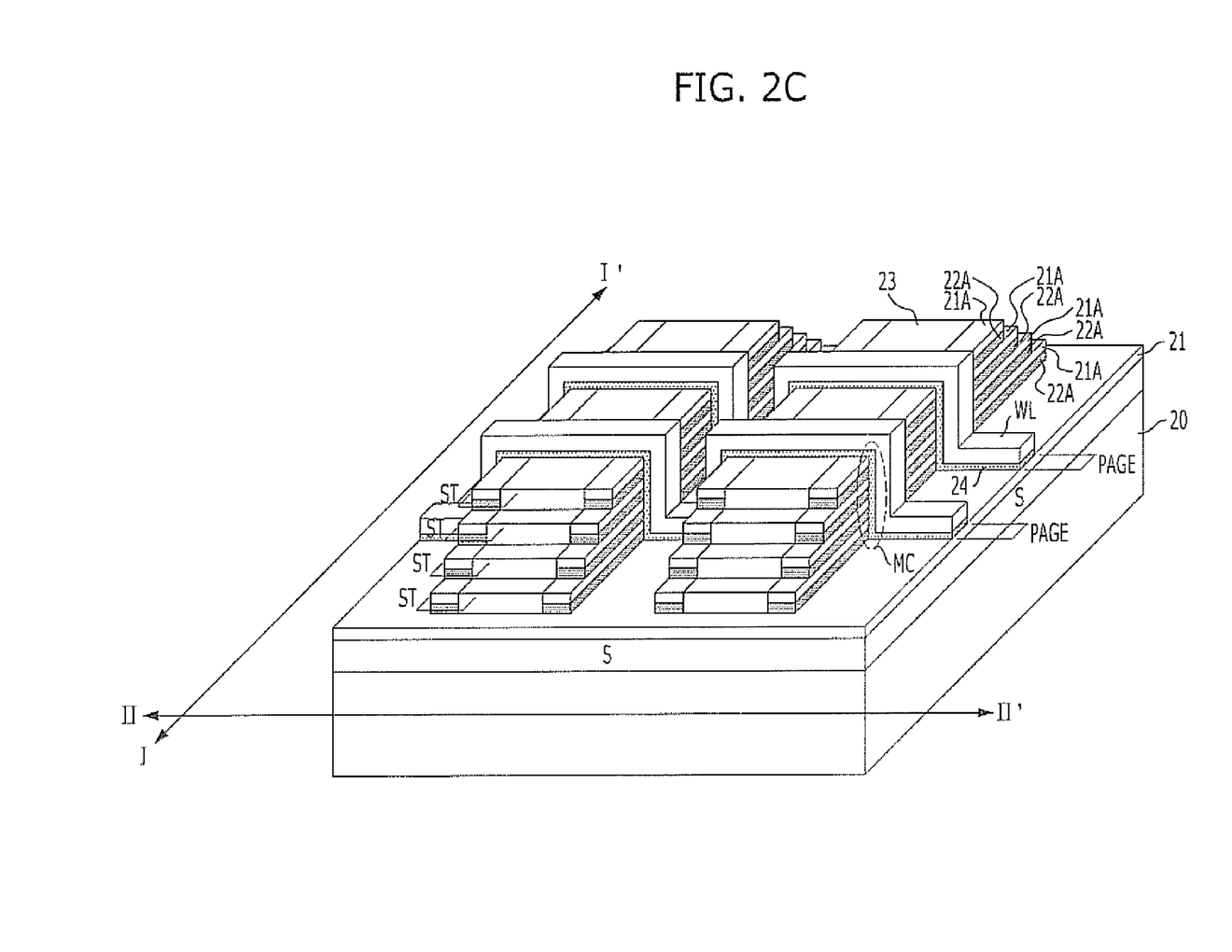

Referring to FIG. 2C, a tunnel insulating layer, a charge capture layer, and a charge blocking layer (not shown) are sequentially formed along the entire surface of the resultant structure having the channel structures A formed therein. After the formation, the tunnel insulating layer, the charge capture layer, and the charge blocking layer are illustrated as one layer 24, for simplicity purposes.

The tunnel insulating layer may be provided as an energy barrier layer for charge tunneling and may be formed of an oxide layer. Furthermore, the charge capture layer may be provided as a charge trap layer for trapping charges or a charge storage layer for storing charges. The charge trap layer may be formed of a nitride layer, and the charge storage layer may be formed of a silicon layer. Furthermore, the charge blocking layer serves to prevent the charges stored in the charge capture layer from moving in a gate electrode direction, and may be formed of a material layer having a high dielectric constant (high K) or an oxide layer.

A conductive layer is formed along the entire surface of the resultant structure having the tunnel insulating layer, the charge capture layer, and the charge blocking layer formed therein. The conductive layer may be formed of a metallic layer.

The conductive layer, the tunnel insulating layer, the charge capture layer, and the charge blocking layer are etched to form a plurality of word lines WL extended in a direction substantially parallel to a second direction II-II' along the profile of the plurality of channel structures A. The tunnel insulating layer, the charge capture layer, and the charge blocking layer which are patterned with the formation of the word lines WL are denoted by reference numeral 24. FIG. 2C illustrates a case in which two word lines WL are formed, as an example.

Accordingly, a plurality of memory cells MC stacked along the sidewalls of the channel structure A are formed. The plurality of memory cells MC connected to the same word line WL in the second direction constitute one page in performing a read/write operation. Furthermore, the plurality of memory cells MC which are arranged in the first direction to share a same channel layer 22A constitute one string ST. That is, the memory cells MC formed in the same channel layer 22A in each channel structure A constitute one string ST. A number of the plurality of strings ST that are stacked matches the number of channel layers 22A included in the channel structure A.

Figure 2D:
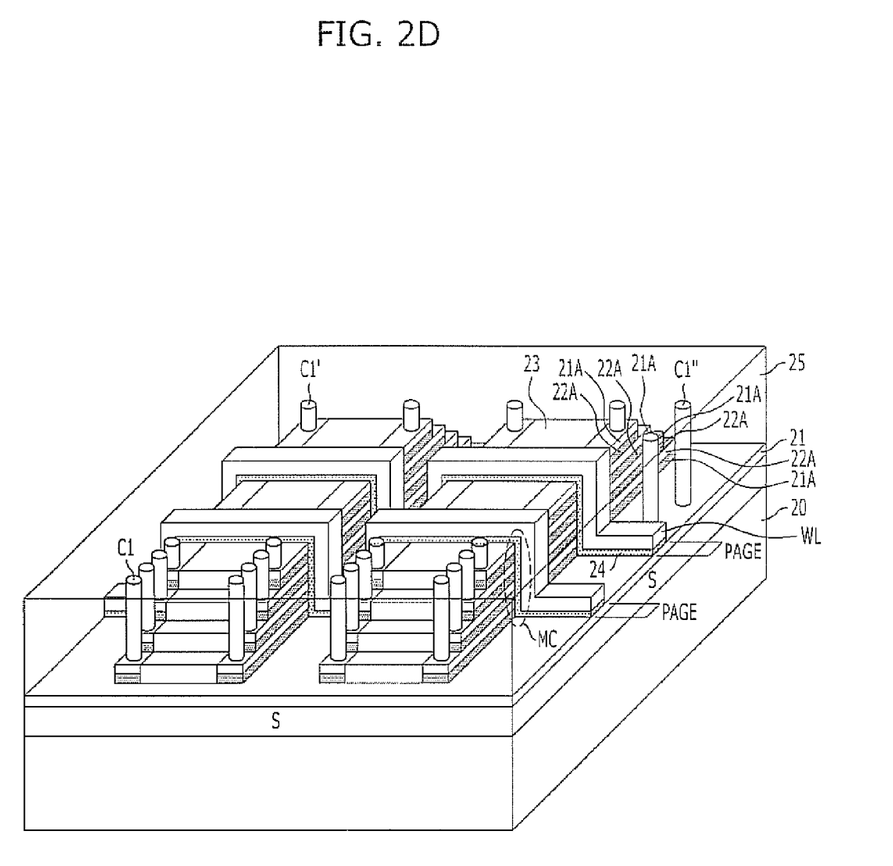

Referring to FIG. 2D, a first interlayer dielectric layer 25 is formed on the entire resultant structure having the plurality of memory cells formed therein.

The first interlayer dielectric layer 25 is etched to form a plurality of first contact holes C1, C1', and C1''. The plurality of first contact holes C1, C1', and C1'' may be formed to different depths depending on their purposes.

For example, the first contact holes C1 that are each connected to the respective channel layer 22A exposed to one sidewall of the channel structure A via a corresponding interlayer dielectric layer are provided to connect a plurality of row select lines to the respective channel layers 22A in a subsequent process, and are formed to expose the respective channel layers 22A included in the channel structure A. The first contact holes C1' formed on the other sidewall of the channel structure A are provided to connect a plurality of column select lines to the respective channel structures A in a subsequent process, and are formed through the plurality of channel layers 22A included in the respective channel structures A. The first contact holes C1'' formed on the source region S of the substrate 20 are provided to connect the source region S to bit fines for controlling the source region S in a subsequent process, and are formed to expose the source region S.

Figure 2E:
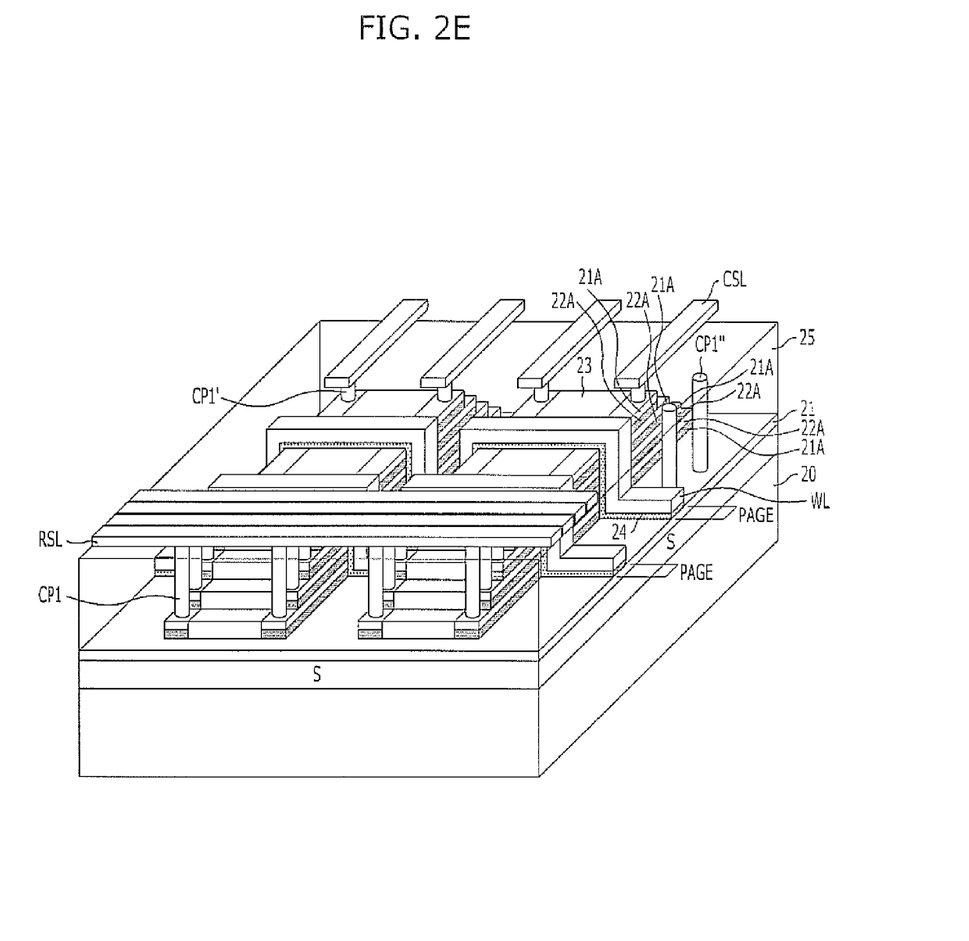

Referring to FIG. 2E, a conductive layer is formed on the entire resultant structure having the first contact holes C1, C1', and C1'' formed therein. While the conductive layer is formed, the conductive layer is buried in the first contact holes C1, C1', and C1'' to form a plurality of first contact plugs CP1, CP1', and CP1'' connected to the plurality of channel layers 22A, respectively.

The conductive layer formed over the resultant structure is patterned to form a plurality of row select lines RSL extended in parallel to the second direction and a plurality of column select lines CSL extended in parallel to the first direction. The plurality of row select lines RSL are connected to the respective channel layers exposed to one sidewall of the channel structure A through the first contact plugs CP1. The plurality of column select lines CSL are connected to the plurality of channel structures A through the first contact plugs CP1', respectively.

Figure 2F:
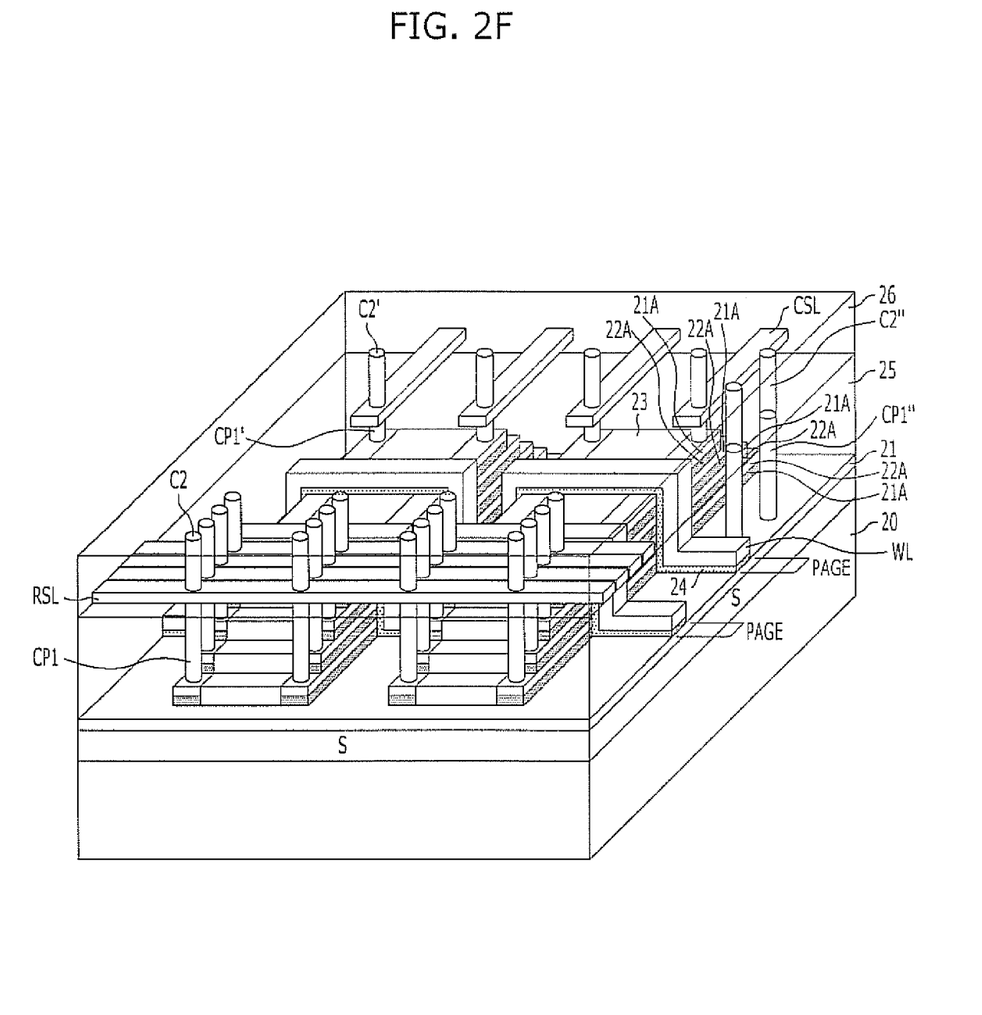

Referring to FIG. 2F, a second interlayer dielectric layer 26 is formed on the entire resultant structure having the row select lines RSL and the column select lines CSL formed therein.

The second interlayer dielectric layer 26, the row select lines RSL, and the column select lines CSL are etched to form a plurality of second contact holes C2, C2', and C2'' exposing the plurality of first contact plugs CP1, CP1', and CP1'', respectively.

The second contact holes C2, C2', and C2'' are provided to form a plurality of row select gates RSG and a plurality of column select gates CSG which are connected to the plurality of channel layers 22A through the first contact plugs CP1, CP1', and CP1'', respectively, and are formed to be integrally connected to the first contact plugs CP1, CP1', and CP1''.

Figure 2G:
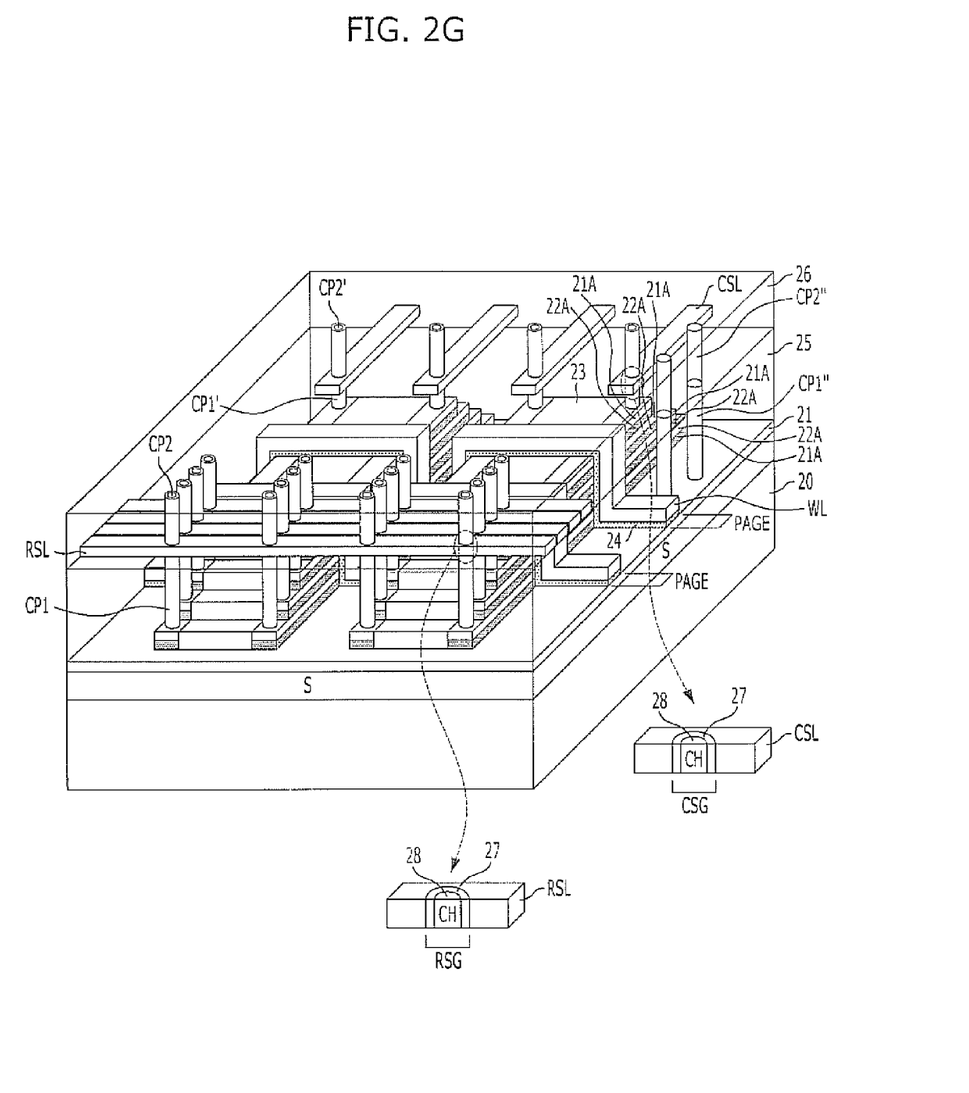

Referring to FIG. 2G, a material layer for a gate dielectric layer is formed along the entire surface of the resultant structure having the second contact holes C2, C2', and C2'' formed therein, and is then etched back to expose the surfaces of the first contact plugs CP1, CP1', and CP1'' on the bottom surfaces of the second contact holes C2, C2', and C2''. Accordingly, a gate dielectric layer 27 is formed on the inner walls of the second contact holes C2, C2', and C2''.

A channel formation layer 28 is buried in the second contact holes C2, C2', and C2'' having the gate dielectric layer 27 formed on the inner walls thereof, thereby forming a plurality of channels CH. Accordingly, the plurality of row select gates RSG, which are connected to the respective, channel layers 22A to select a desired string ST when a predetermined operation is performed, and the plurality of column select gates CSG, which are connected to the respective channel structures A to select a desired memory block when a predetermined operation is performed, are formed.

The plurality of row select gates RSG are connected to the plurality of channel layers 22A, respectively, through the first contact plugs CP1. Each of the row select gates RSG includes the pillar-shaped channel CH and the gate dielectric layer 27 interposed between the pillar-shaped channel CH and the corresponding row select line RSL and surrounding the pillar-shaped channel CH.

The plurality of column select gates CSG are connected to the plurality of channel structures A, respectively, through the first contact plugs CP1'. Each of the column select gates CSG includes the pillar-shaped channel CH and the gate dielectric layer 27 interposed between the pillar-shaped channel CH and the corresponding column select line CSL and surrounding the pillar-shaped channel CH.

As such, when the row select gates RSG and the column select gates CSG having a MOS-CAP (that is, MOS capacitance) structure which does not include a source and a drain are formed, a separate impurity ion implantation process for source/drain formation may be omitted.

At this time, while the row select gates RSG and the column select gates CSG are formed, the second contact plugs CP2, CP2', and CP2" buried in the second interlayer dielectric layer 26 may be formed together. In this case, the second contact plugs CP2, CP2', and CP2" all have the same structure (that is, row select gates RSG and the column select gates CSG).

Figure 2H:
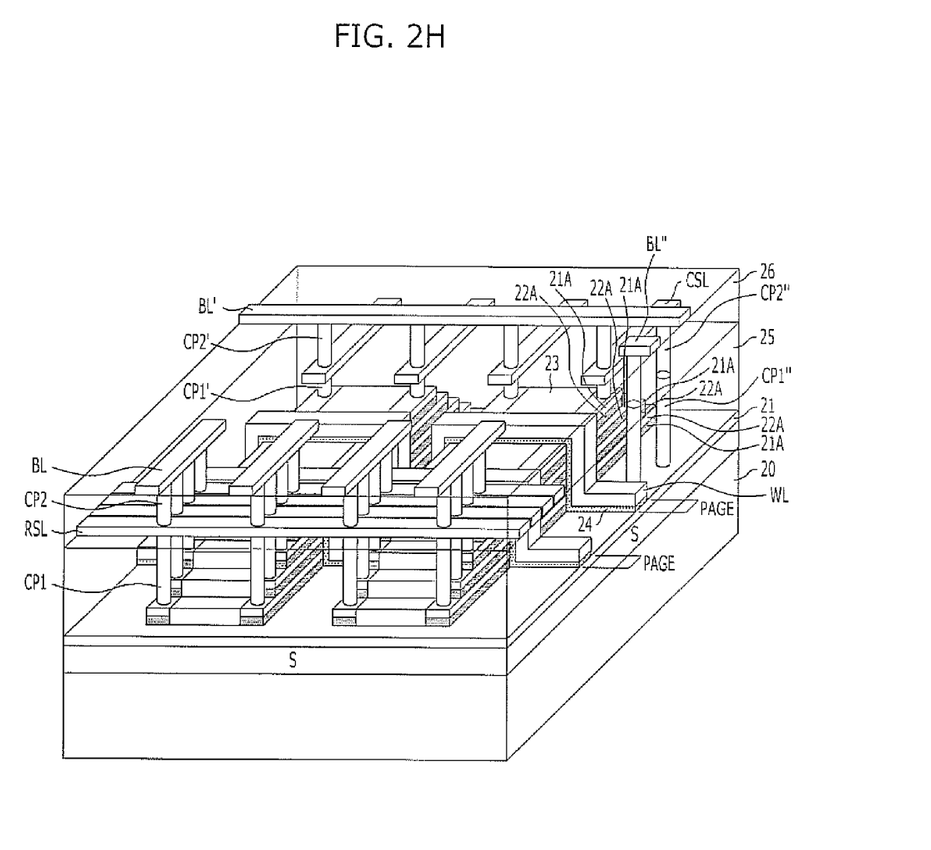

Referring to FIG. 2H, a conductive layer is formed on the entire resultant structure having the row select gates RSG and the column select gates CSG formed therein. The conductive layer may include a metallic layer, for example.

After the formation, the conductive layer is patterned to form a plurality of bit lines BL, BL', and BL". The bit lines BL are extended in parallel to the first direction, while being connected to the row select lines RSL through the second contact plugs CP2. Furthermore, the bit lines BL' are extended in parallel to the second direction, while being connected to the column select lines CSL through the second contact plugs CP2'. Furthermore, the bit lines BL" are connected to the source region S through the first contact plugs CP1" and the second contact plugs CP2".

In accordance with the above-described embodiment of the present invention, the row select gates RSG and the column select gates CSG may be formed at the same time. Therefore, compared with the conventional method in which the lower select transistor, the plurality of memory cells, and the upper select transistor are formed through three steps, the fabricating process may be simplified to reduce the fabricating cost.

Figure 3A:
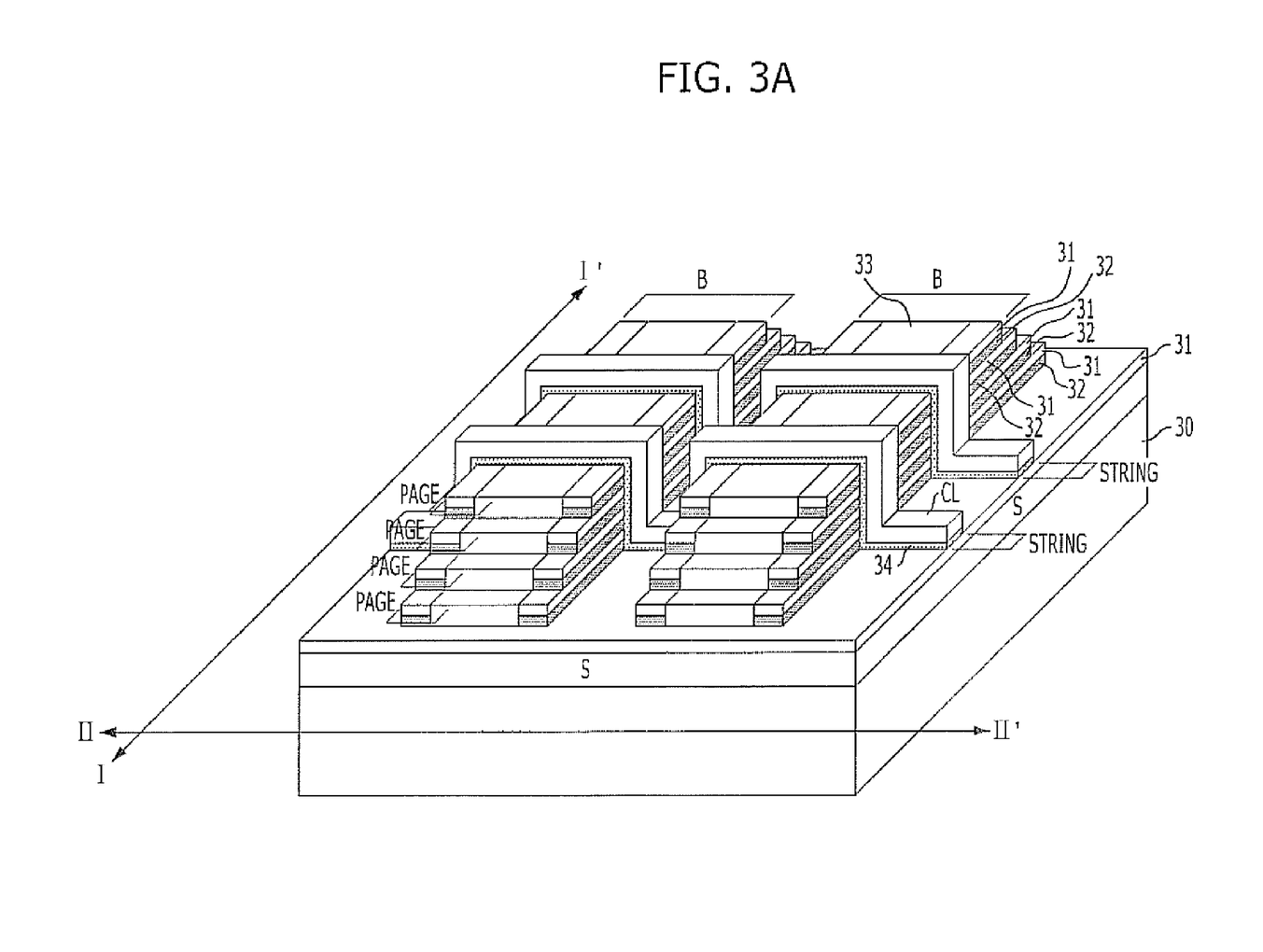
FIGS. 3A to 3C are perspective view illustrating a method for fabricating a 3D nonvolatile memory device in accordance with a second embodiment of the present invention.
Figure 3B:
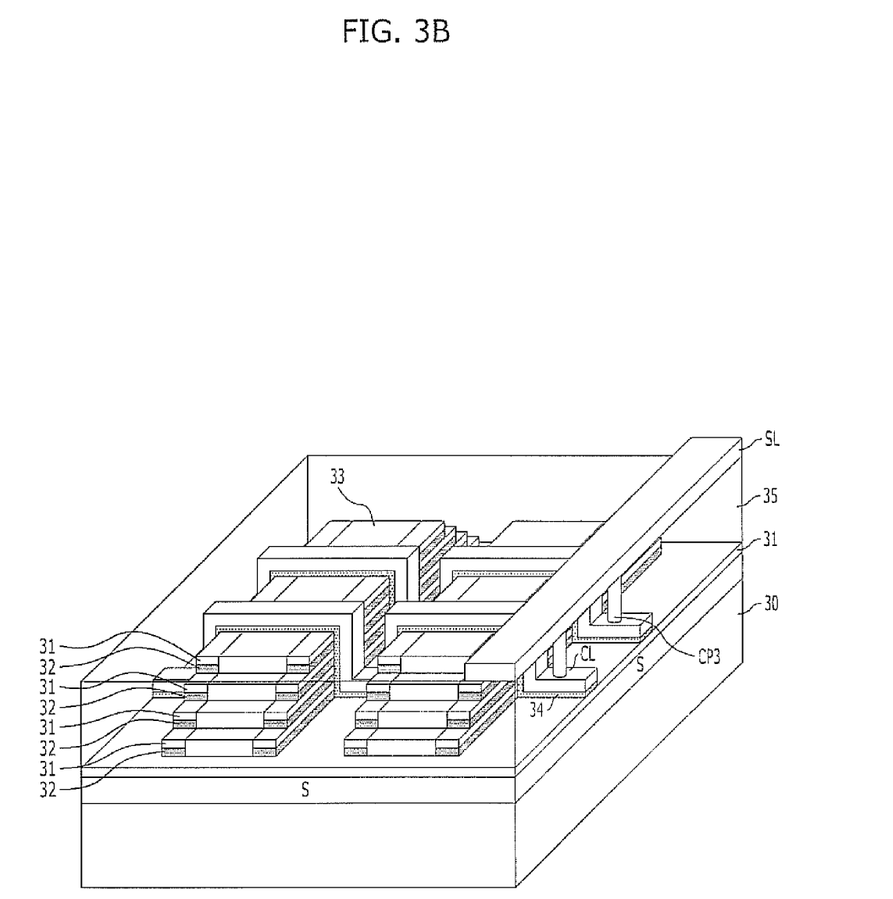
Figure 3C:
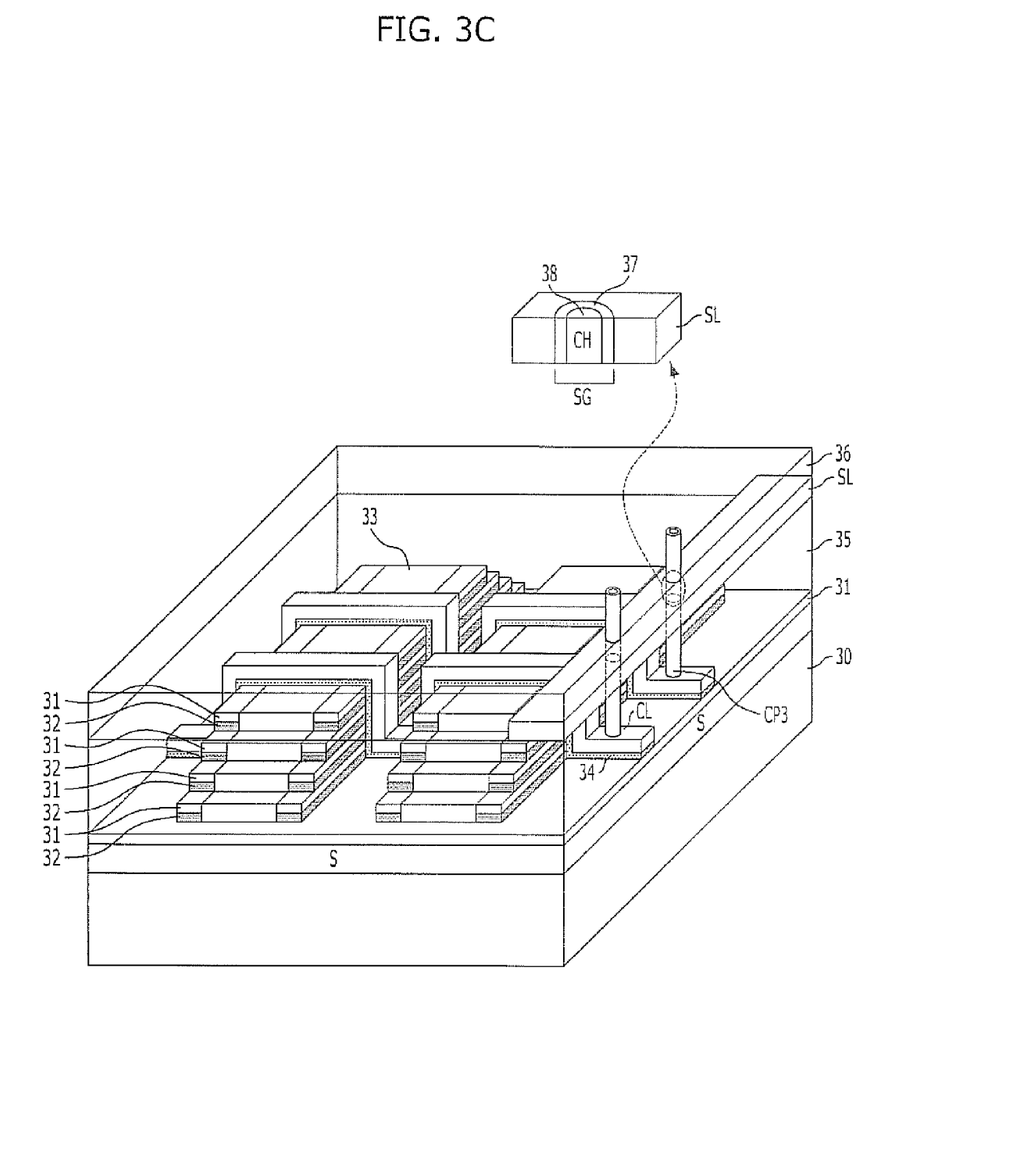

FIGS. 3A to 3C are perspective views illustrating a method for fabricating a 3D nonvolatile memory device in accordance with a second embodiment of the present invention. The duplicated descriptions of the components described in the first embodiment of the present invention will be omitted.

Referring to FIG. 3A, a plurality of gate structures B extended in parallel to a first direction I-I' are formed over a substrate 30 having a required lower structure including a source region S and any other structure.

Each of the gate structures B includes a plurality of interlayer dielectric layers 31 and gate electrode layers 32, which are alternately formed. The interlayer dielectric layers 31 separate the stacked gate electrode layers 32 from each other. The gate electrode layers 32 form gate electrodes of memory cells, and the number of gate electrode layers 32 to be stacked corresponds to the number of pages to be stacked on the substrate 30.

An insulating layer 33 may be formed to fill alternate gap regions between the respective gate structures B.

Although not shown, charge blocking layer, a charge capture layer, and a tunnel insulating layer are sequentially formed along the entire surface of the resultant structure having the gate structures B formed therein, and a channel formation layer is then formed. After the formation, the channel formation layer, the tunnel insulating layer, the charge capture layer, and the charge blocking layer are etched to form a plurality of channel lines CL extended in parallel to a second direction along the entire surface of the gate structures B. In FIG. 3A, the charge blocking layer, the charge capture layer, and the tunnel insulating layer are illustrated as one layer represented by reference numeral 34, for convenience of description.

Accordingly, a plurality of memory cells stacked along the gate structures B are formed. The plurality of memory cells sharing the gate electrode layer 32 constitute one page PAGE to perform a read/write operation. Furthermore, the plurality of memory cells sharing the same channel line CL constitute one string STRING.

Referring to FIG. 3B, a third interlayer dielectric layer 35 is formed on the entire resultant structure, and then etched to form a plurality of third contact holes exposing the surfaces of the respective channel lines CL, respectively. The third contact holes are provided to connect a plurality of select lines to the plurality of channel lines CL, respectively, in a subsequent process.

While not shown, a conductive layer is formed on the entire resultant structure having the third contact holes formed therein. As such, while the conductive layer is formed, the conductive layer is buried in the third contact holes to form a plurality of third contact plugs CP3 connected to the plurality of channel lines CL, respectively.

The conductive layer formed on the resultant structure is patterned to form a plurality of select lines SL extended in parallel to the first direction. The plurality of select lines SL are connected to the plurality of channel lines CL, respectively, through the third contact plugs CP3.

Referring to FIG. 3C, a fourth interlayer dielectric layer 36 is formed on the resultant structure having the select lines SL formed therein. Then, the fourth interlayer dielectric layer 36 and the select lines SL are etched to form a plurality of fourth contact holes exposing the third contact plugs CP3.

A gate dielectric layer 37 is formed on the inner walls of the fourth contact holes, and a channel formation layer 38 is buried in the fourth contact holes having the gate dielectric layer 37 formed on the inner walls thereof, thereby forming a plurality of channels CH. Accordingly, a plurality of select gates SG are formed, each including the pillar-shaped channel 38 and the gate dielectric layer 37 interposed between the pillar-shaped channel 38 and the corresponding select line SL.

Although not illustrated in FIG. 3C, a subsequent process may be performed, in which a conductive layer is formed on the resultant structure having the select gates formed therein and then patterned to form bit lines.

In accordance with the embodiments of the present invention, the 3D nonvolatile memory device having the plurality of strings stacked on the substrate may be fabricated. In particular, the channel structures having the plurality of channel layers stacked therein or the gate structures having the plurality of gate electrode layers stacked therein are used to form the plurality of memory cells. Therefore, the uniformity of the channel widths may be improved, the uniformity of threshold voltages may also be improved.

Furthermore, since the select gates having a pillar-shaped 3D structure are formed after the plurality of memory cells are formed, the select gates having a MOS-CAP structure may be conveniently formed. In particular, since the row select lines and the column select lines are formed by, for example, one process at the same time, the fabricating process may be simplified the fabricating cost may be reduced.

While the present invention has been described with respect to the specific embodiments, it will be apparent to those skilled in the art that various changes and modifications may be made without departing from the spirit and scope of the invention as defined in the following claims.

What is claimed is:

1. A three dimensional (3D) nonvolatile memory device comprising:
    a plurality of channel structures comprising a plurality of channel layers and interlayer dielectric layers, which are alternately stacked, and extended in a first direction;
    a plurality of word lines extended in a second direction at least substantially perpendicular to the first direction;
    a plurality of row select lines connected to the plurality of channel layers, respectively, and extended in the second direction; and a plurality of column select lines connected to the plurality of channel structures, respectively, and extended in the first direction.

2. The 3D nonvolatile memory device of claim 1, wherein the row select lines are connected to the plurality of channel layers, respectively, to select a memory string when an operation is performed.

3. The 3D nonvolatile memory device of claim 1, wherein the row select lines comprise a plurality of row select gates connected to the plurality of channel layers, respectively.

4. The 3D nonvolatile memory device of claim 3, wherein each of the row select gates comprises:
   a pillar-shaped channel connected to the corresponding channel layer; and
   a gate dielectric layer surrounding the pillar-shaped channel and interposed between the pillar-shaped channel and the corresponding row select line.

5. The 3D nonvolatile memory device of claim 1, wherein the column select lines are connected to the plurality of channel structures, respectively, to select a memory block when an operation is to be performed on the memory block.

6. The 3D nonvolatile memory device of claim 1, wherein the column select lines comprise a plurality of column select gates connected to the plurality of channel structures, respectively.

7. The 3D nonvolatile memory device of claim 6, wherein each of the column select gates comprises:
   a pillar-shaped channel connected to the corresponding channel structure; and
   a gate dielectric layer surrounding the pillar-shaped channel and interposed between the pillar-shaped channel and the corresponding column select line.

8. The 3D nonvolatile memory device of claim 1, further comprising a plurality of bit lines connected to the plurality of row select lines, respectively, and extended in the first direction.

9. The 3D nonvolatile memory device of claim 1, further comprising a plurality of bit lines connected to the plurality of column select lines, respectively, and extended in the second direction.

10. The 3D nonvolatile memory device of claim 1, wherein the channel structures are patterned in a stair shape as to expose the plurality of channel layers for making contact, respectively.

11. A three dimensional (3D) nonvolatile memory device comprising:
   a plurality of gate structures comprising a plurality of interlayer dielectric layers and gate electrode layers, which are alternately stacked, and extended in a first direction;
   a plurality of channel lines extended in a second direction at least substantially perpendicular to the first direction;
   a plurality of select lines connected to the plurality of channel lines, respectively;
   a plurality of select gates buried in the respective select lines and connected to the respective channel lines.

12. The 3D nonvolatile memory device of claim 11, wherein each of the select gates comprises:
   a pillar-shaped channel connected to the corresponding channel line; and
   a gate dielectric layer surrounding the pillar-shaped channel and interposed between the pillar-shaped channel and the corresponding select line.

13. A method for fabricating a three dimensional (3D) nonvolatile memory device, comprising:
   forming a plurality of channel structures over a substrate, the plurality of channel structures comprising a plurality of channel layers and interlayer dielectric layers, which are alternately stacked, and extended in a first direction;
   forming a plurality of word lines extended in a second direction at least substantially perpendicular to the first direction;
   forming a plurality of row select lines connected to the plurality of channel layers, respectively, and extended in the second direction; and
   forming a plurality of column select lines connected to the plurality of channel structures, respectively, and extended in the first direction.

14. The method of claim 13, wherein the forming of the plurality of row select lines is performed at the same time as the forming of the plurality of column select lines.

15. The method of claim 13, wherein the forming of the plurality of row select lines comprises:
   forming a first interlayer dielectric layer over the entire resultant structure having the plurality of word lines formed therein;
   etching the first interlayer dielectric layer to form a plurality of first contact holes exposing the plurality of channel layers, respectively;
   forming a plurality of first contact plugs by forming a conductive layer over the entire resultant structure with the first contact holes formed therein; and
   patterning the conductive layer to form the plurality of row select lines.

16. The method of claim 15, further comprising forming a plurality of row select gates within the plurality of row select lines, the plurality of row select gates being connected to the plurality of channel layers, respectively, to select a memory string when an operation is to be performed on the memory string, after the forming of the plurality of row select lines.

17. The method of claim 16, wherein the forming of the plurality of row select gates comprises:
   forming a second interlayer dielectric layer over the entire resultant structure having the plurality of row select lines formed therein;
   etching the second interlayer dielectric layer and the row select lines to form a plurality of second contact holes exposing the plurality of first contact plugs, respectively;
   forming a gate dielectric layer on inner walls of the second contact holes; and
   forming a plurality of channels by burying a channel formation layer in the second contact holes having the gate dielectric layer formed on the inner walls thereof.

18. The method of claim 17, further comprising:
   forming a conductive layer over the entire resultant structure having the row select gates formed therein; and
   patterning the conductive layer to form a plurality of bit lines extended in the first direction, after the forming of the plurality of row select gates.

19. The method of claim 13, wherein the forming of the plurality of column select lines comprises:
   forming a first interlayer dielectric layer over the entire resultant structure having the plurality of word lines formed therein;
   etching the first interlayer dielectric layer and the channel structures to form a plurality of first contact holes passing through the plurality of channel layers included in the channel structures;
   forming a plurality of first contact plugs by forming a conductive layer over the entire resultant structure having the first contact holes formed therein; and
   patterning the conductive layer to form the plurality of column select lines.

20. The method of claim 19, further comprising forming a plurality of column select gates within the plurality of column select lines, the plurality of column select gates being connected to the plurality of channel structures, respectively, to select a memory block when an operation is to be performed on the memory block, after the forming of the plurality of column select lines.

21. The method of claim 20, wherein the forming of the plurality of column select gates comprises:
forming a second interlayer dielectric layer over the entire resultant structure having the plurality of column select lines formed therein;
etching the second interlayer dielectric layer and the row select lines to form a plurality of second contact holes exposing the plurality of first contact plugs, respectively; forming a gate dielectric layer on inner walls of the second contact holes; and
burying a channel formation layer in the second contact holes having the gate dielectric layer formed on the inner walls thereof.

22. The method of claim 21, further comprising:
forming a conductive layer over the entire resultant structure having the column select gates formed therein; and
patterning the conductive layer to form a plurality of bit lines extended in the second direction, after the forming of the plurality of column select gates.

23. The method of claim 13, further comprising:
patterning the channel structures in a stair shape as to expose the plurality of channel layers, respectively, after the forming of the plurality of channel structures.

* * * * *